United States Patent
Frederick, Jr. et al.

(10) Patent No.: US 11,011,222 B2
(45) Date of Patent: May 18, 2021

(54) MEMORY STRUCTURE WITH BITLINE STRAPPING

(71) Applicant: Arm Limited, Cambridge (GB)

(72) Inventors: Marlin Wayne Frederick, Jr., Austin, TX (US); Ronald Paxton Preston, Austin, TX (US); Andy Wangkun Chen, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/294,577

(22) Filed: Mar. 6, 2019

(65) Prior Publication Data

US 2020/0286548 A1 Sep. 10, 2020

(51) Int. Cl.
*G11C 11/412* (2006.01)
*G11C 11/419* (2006.01)

(52) U.S. Cl.
CPC .......... *G11C 11/412* (2013.01); *G11C 11/419* (2013.01)

(58) Field of Classification Search
CPC .............................. G11C 11/412; G11C 11/419
USPC ................ 365/156, 154, 189.01, 189.02
See application file for complete search history.

(56) References Cited

U.S. PATENT DOCUMENTS

| | | | | |
|---|---|---|---|---|
| 5,815,432 A | * | 9/1998 | Naffziger | G11C 11/412 365/154 |
| 2007/0127305 A1 | * | 6/2007 | Imai | G11C 11/418 365/230.04 |
| 2010/0220527 A1 | * | 9/2010 | Norman | G11C 19/287 365/185.05 |
| 2010/0260001 A1 | * | 10/2010 | Kasprak | G11C 29/50 365/201 |
| 2019/0066773 A1 | * | 2/2019 | Park | G11C 11/419 |

* cited by examiner

*Primary Examiner* — Connie C Yoha
(74) *Attorney, Agent, or Firm* — Pramudji Law Group PLLC; Ari Pramudji

(57) ABSTRACT

Various implementations described herein refer to an integrated circuit having an array of bitcells coupled between at least one pair of bitlines including a first bitline and a second bitline that is a complement of the first bitline. The integrated circuit may include at least one pair of ancillary lines disposed adjacent to the at least one pair of bitlines, and the at least one pair of ancillary lines include a first ancillary line disposed adjacent to the first bitline and a second ancillary line disposed adjacent to the second bitline. The integrated circuit may include multiple pairs of passgates coupled between the at least one pair of bitlines and the at least one pair of ancillary lines.

17 Claims, 8 Drawing Sheets

MEMORY STRUCTURE WITH BITLINE STRAPPING

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern memory design, poor resistance scaling has increasingly become a problem as the integrated circuit (IC) industry scales down feature density. One traditional method of improving resistance refers to adding additional higher metal line straps. While this can be effective in reducing resistance, it may increase capacitance. Therefore, this becomes a difficult problem for memory designers as resistance and capacitance do not scale down together. There can be a trade-off of lower resistance with higher capacitance or vice versa. High resistance impacts memory write margins and write performance, and high capacitance impacts memory read performance and read dynamic power.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various metal layout schemes and techniques for providing a memory structure with bitline strapping. In some implementations, the metal layout may refer to an integrated circuit having memory cells, such as, e.g., 6T bitcells, with programmable metal lines in multi-pattern lithography. The metal layout schemes and techniques described herein may provide for innovative bitline strapping that advantageously reduces resistance on the bitlines during write operations and advantageously reduces capacitance on the bitlines during read operations.

Various implementations described herein are associated with memory designs that use programmable bitline strapping schemes and techniques. In some instances, the memory design schemes and techniques described herein may be used to to reduce bitline resistance during write cycles without increasing bitline capacitance during read cycles. These various schemes and techniques may be implemented to improve memory writeability without impacting read access time and read dynamic power.

Various implementations of metal layout schemes and techniques for memory structures having bitline strapping will now be described in detail herein with reference to FIGS. 1-6. The various implementations described herein may be applied to single port memory, dual-port memory, and/or any other type of multi-port memory.

Figure 1:
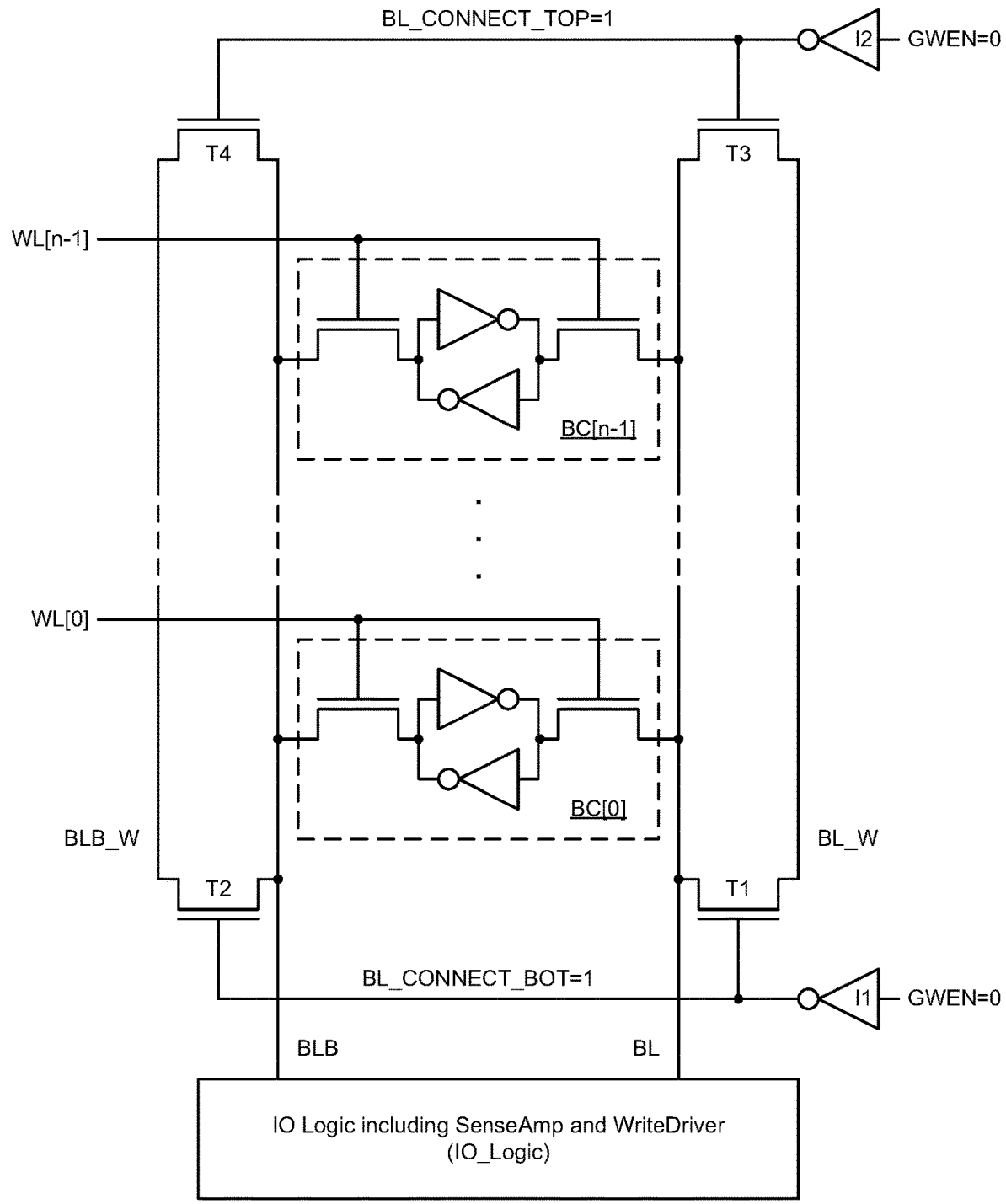
FIG. 1 illustrates a diagram of a memory structure having bitline strapping in accordance with various implementations described herein.

FIG. 1 illustrates a diagram of a memory structure 100 with bitline strapping (BL_W, BLB_W) in accordance with various implementations described herein. In some implementations, the memory structure 100 may be implemented as an integrated circuit (IC) that is configured as a single port memory structure.

As shown in FIG. 1, the memory structure 100 may include an array of bitcells (BC[0], . . . , BC[n−1]) arranged in columns and rows, and each bitcell (BC[0], . . . , BC[n−1]) is accessible via bitlines (BL, BLB) and wordlines (WL[0], . . . , WL[n−1]). In FIG. 1, even though a single column is shown, the array of bitcells may have any number of columns along with any number of rows. Also, each bitcell (BC[0], . . . , BC[n−1]) may be configured to store at least one data bit value (e.g., a data value related to a logical '0' or '1'). The array of bitcells (BC[0], . . . , BC[n−1]) are coupled between at least one pair of bitlines (BL, BLB), and the bitlines (BL, BLB) include a first bitline (BL) and a second bitline (BLB) that is a complement of the first bitline (BL). Also, the memory structure 100 may include at least one pair of ancillary lines (BL_W, BLB_W) that corresponds to the bitlines (BL, BLB), respectively. The at least one pair of ancillary lines (BL_W, BLB_W) are disposed adjacent to the at least one pair of bitlines (BL, BLB), and the at least one pair of ancillary lines (BL_W, BLB_W) may include a first ancillary line (BL_W) disposed adjacent to the first bitline (BL) and a second ancillary line (BLB_W) that is disposed adjacent to the second bitline (BLB). Also, the memory structure 100 may include input/output (IO) logic circuitry (IO_logic) having multiple types of read/write circuits, such as, e.g., a sense amplifier (SA) and a write driver (WD) that are coupled to the bitlines (BL, BLB) for each column.

The array of bitcells (BC[0], . . . , BC[n−1]) may include any number of bitcells arranged in various configurations, such as, e.g., a two-dimensional (2D) memory array having any number of columns and any number of rows of multiple bitcells. Also, each bitcell (BC[0], . . . , BC[n−1]) may be implemented with random access memory (RAM) circuitry, and/or some other type of volatile memory. For instance, each bitcell may include a multi-transistor static RAM (SRAM) cell, including various types of SRAM cells, such as, e.g., 6T CMOS SRAM (as shown in FIG. 4A) and/or other type of complementary MOS (CMOS) SRAM cells, such as, e.g., 4T, 8T, 10T, or more transistors per bit. As described herein, the memory structure 100 may operate at a source voltage level (VCC/VDD) with a voltage range that varies with technology and memory application.

In some implementations, the memory structure 100 may include multiple pairs of passgates (T1/T2 and T3/T4) that are coupled between the at least one pair of bitlines (BL, BLB) and the at least one pair of ancillary lines (BL_W, BLB_W). In some instances, each passgate (T1, T2, T3, T4) of the multiple pairs of passgates (T1/T2 and T3/T4) may be selectively activated with a write enable signal (e.g., GWEN) during write operations so as to reduce resistance on the pair of bitlines (BL, BLB) during the write operations. For instance, during each write operation, all of T1/T2/T3/T4 are activated, and the resistance on both bitlines (BL, BLB) is reduced. The write enable signal (GWEN) may be a global write enable signal. In other instances, each passgate (T1, T2, T3, T4) of the multiple pairs of passgates (T1/T2 and T3/T4) may be selectively deactivated with the write enable signal (e.g., GWEN) during read operations so as to reduce capacitance on the pair of bitlines (BL, BLB) during the read operations. For instance, during each read operation, all of T1/T2/T3/T4 are activated, and the capacitance on both bitlines (BL, BLB) is reduced.

In some implementations, the multiple pairs of passgates (T1/T2 and T3/T4) may include a first pair of passgates (T1/T2) and a second pair of passgates (T3/T4). The first pair of passgates (T1/T2) may include a first passgate (T1) coupled between the first bitline (BL) and the first ancillary line (BL_W), and the first pair of passgates (T1/T2) may include a second passgate (T2) coupled between the second bitline (BLB) and the second ancillary line (BLB_W). Also, the second pair of passgates (T3/T4) may include a third passgate (T3) coupled between the first bitline (BL) and the first ancillary line (BL_W), and the second pair of passgates (T3/T4) may include a fourth passgate (T4) coupled between the second bitline (BLB) and the second ancillary line (BLB_W). In this instance, the first pair of passgates (T1/T2) may be implemented with a first transistor (T1) and a second transistor (T2), and the second pair of passgates (T3/T4) may be implemented with a third transistor (T3) and a fourth transistor (T4). In some implementations, the transistors (T1, T2, T3, T4) may be N-type metal-oxide-semiconductor (NMOS) transistors. However, in other implementations, P-type MOS transistors may be used.

In some implementations, as shown in FIG. 1, the memory structure 100 may include multiple inverters (I1, I2) coupled to gates of the multiple pairs of passgates (T1/T2 and T3/T4). The multiple inverters (I1, I2) may receive the write enable signal (GWEN), invert the write enable signal (GWEN), and provide an inverted write enable signal to the gates of the multiple pairs of passgates (T1/T2 and T3/T4). The multiple passgates (T1, T2, T3, T4) may be activated based on the inverted write enable signal provided by the first inverter (I1) and the second inverter (I2). The multiple inverters (I1, I2) may include a first inverter (I1) and a second inverter (I2), and the first inverter (I1) is coupled to the gates of the first pair of passgates (T1/T2), and the second inverter (I2) is coupled to the gates of the second pair of passgates (T2/T4).

Also, the first pair of passgates (T1/T2) have their gates coupled to an output of the first inverter (I1) via a first (or bottom) bitline connection line (BL_CONNECT_BOT), and the second pair of passgates (T3/T4) have their gates coupled to an output of the second inverter (I2) via a second (or top) bitline connection line (BL_CONNECT_TOP). In this instance, the first inverter (I1) and the second inverter (I2) receive the write enable signal (GWEN) having a logic state of zero (0) and provide an inverted write enable signal having a logic state of one (1) to the gates of the passgates (T1, T2, T3, T4) for activation thereof via the first (or bottom) bitline connection line (BL_CONNECT_BOT) and the second (or top) bitline connection line (BL_CONNECT_TOP).

In some instances, during write cycles/operations, the write enable signal may be provided as GWEN=0 so as to drive BL_CONNECT_BOT and BL_CONNECT_TOP to logic 1 to turn on passgates (T1, T2, T3, T4). This reduces bitline resistance to improve writeability. In other instances, during read cycles/operations, the write enable signal may be provided as GWEN=1 so as to drive BL_CONNECT_BOT and BL_CONNECT_TOP to logic 0 to turn off passgates (T1, T2, T3, T4). This may reduce bitline capacitance to improve read timing. In reference to FIG. 1, these schemes and techniques may be used to improve bitline (BL) and bitline_bar (BLB) resistance by using the extra metal lines of BL_W and BLB_W. Instead of connecting (BL_W to BL) and (BLB_W to BLB) through hard connections, the extra programmable passgates (T1, T2, T3, T4) are added. During write cycles, the passgates (T1, T2, T3, T4) may be turned on to reduce bitline resistance, and during read cycles, the passgates (T1, T2, T3, T4) may be turned off to disconnect BL_W and BLB_W to avoid capacitance penalties.

The various schemes and techniques may provide advantages. For instance, advantages may be related to performance and/or timing, wherein a reduction in bitline resistance may improve write margin and write cycle time, and wherein higher resistance may typically not be an issue for memory read, because read performance may be mostly dominated by bitline capacitance and small signal differential read. In some instances, advantages may be related to power, wherein bitline capacitance may be reduced during read cycles, which may reduce read dynamic power, and this may improve dynamic power on the bitlines due to capacitance reduction. In some instances, advantages are related to bitline resistance improvement for write cycles, wherein the schemes described herein may significantly reduce resistance during write cycles. In other instances, advantages are related to bitline capacitance improvement for read cycles, wherein the techniques described herein may significantly reduce capacitance during read cycles. Further, some advantages may be related to adding extra passgates to ensure BL_W and BLB_W are precharged at the end of read/write memory cycles and/or operations, as will be described herein below in reference to FIG. 4.

Figure 2A:
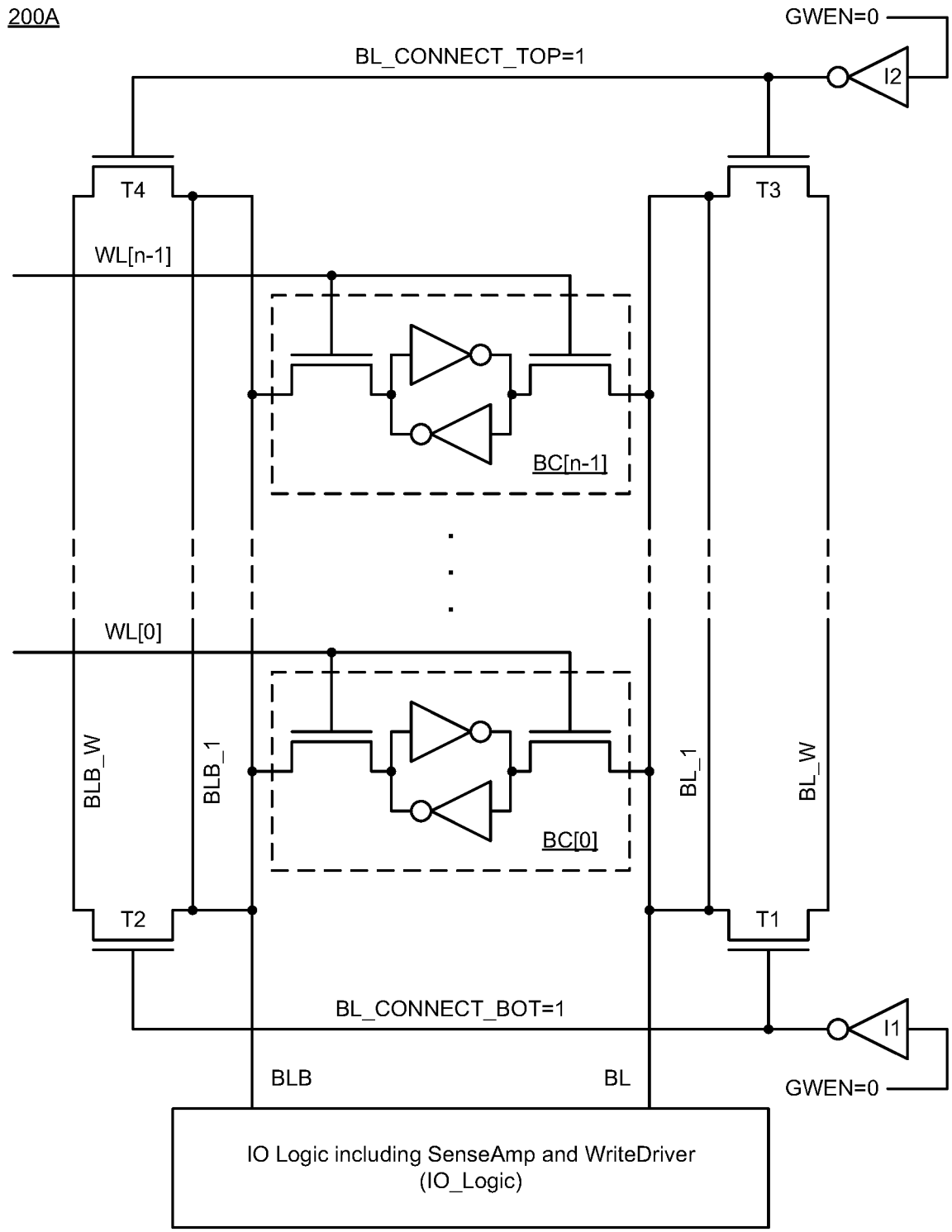
FIGS. 2A-2B illustrate diagrams of memory structures having multi-layered bitline strapping in accordance with various implementations described herein.
Figure 2B:
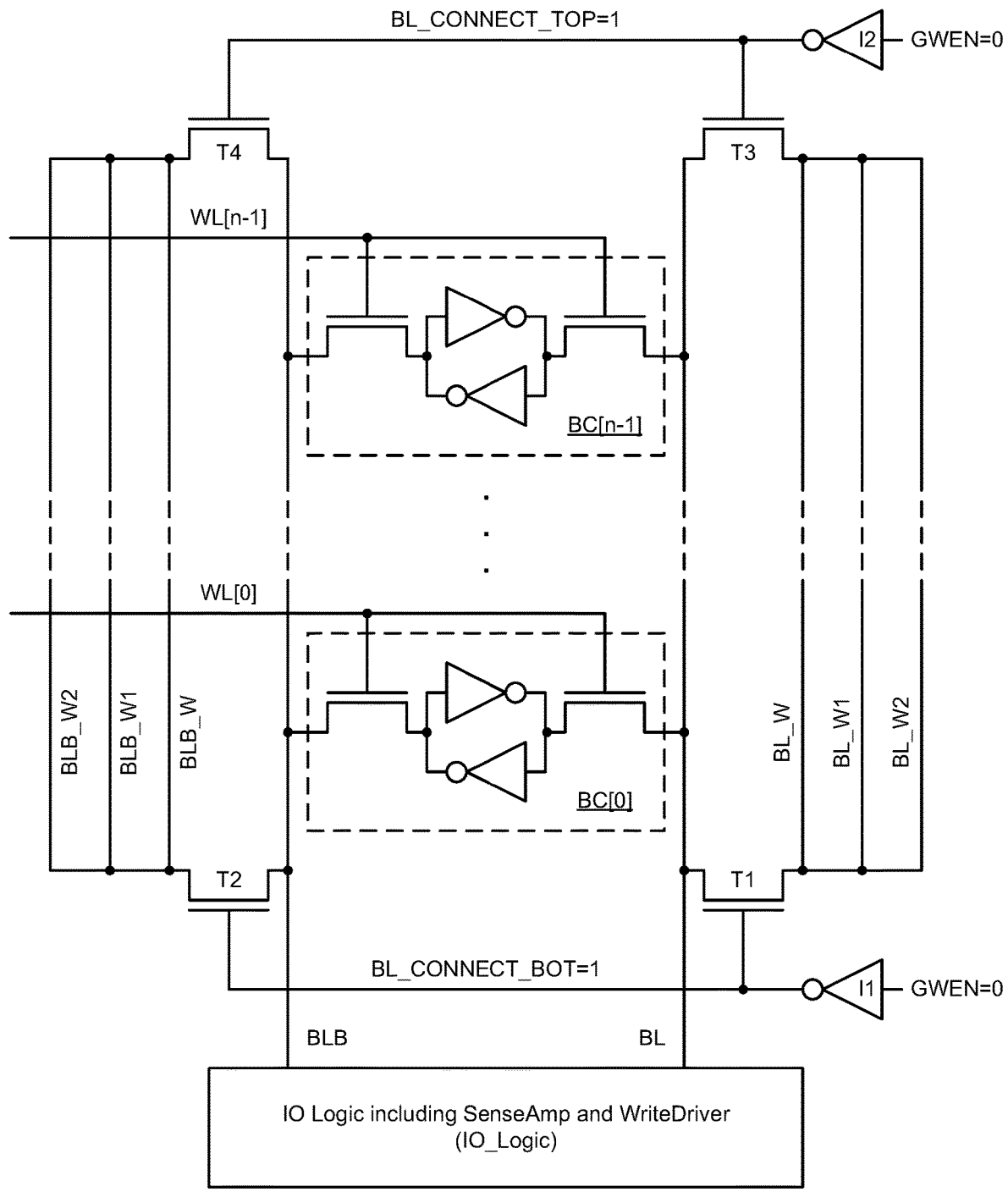

FIGS. 2A-2B illustrate diagrams of memory structures 200A, 200B with multi-layered bitline strapping in accordance with various implementations described herein. In particular, FIG. 2A illustrates a diagram of the memory structure 200A with multi-layered bitline strapping, and FIG. 2B illustrates a diagram of the memory structure 200B with multi-layered ancillary line strapping. The memory structures 200A, 200B in FIGS. 2A-2B have similar components and features as described in reference to memory structure 100 of FIG. 1.

As shown in FIG. 2A, each bitline (BL, BLB) of the at least one pair of bitlines (BL, BLB) may have one or more layers (BL/BL_1 and BLB/BLB_1) that may be arranged in a z-direction, and as shown, each layer (BL/BL_1 and BLB/BLB_1) of the one or more layers (BL/BL_1 and BLB/BLB_1) may be electrically shorted together.

As shown in FIG. 2B, each ancillary line (BL_W, BLB_W) of the at least one pair of ancillary lines (BL_W, BLB_W) may have one or more additional ancillary layers (BL_W/BL_W1/BL_W2 and BLB_W/BLB_W1/BLB_W2) arranged in the z-direction, and as shown, each layer (BL_W/BL_W1/BL_W2 and BLB_W/BLB_W1/BLB_W2) of the one or more additional ancillary layers may be electrically shorted together.

Figure 3:
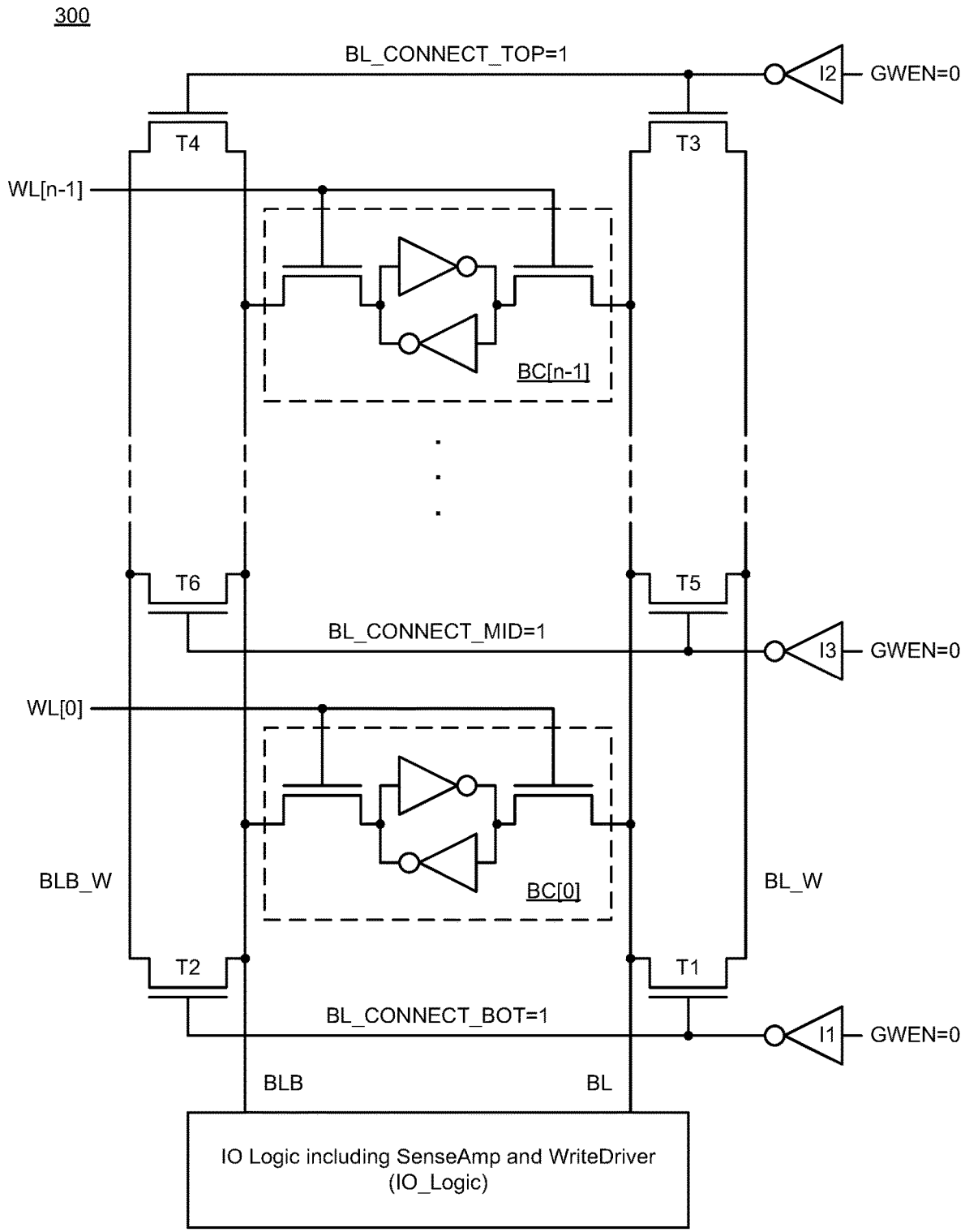
FIG. 3 illustrates another diagram of a memory structure with bitline strapping in accordance with various implementations described herein.

FIG. 3 illustrates another diagram of a memory structure 300 having bitline strapping in accordance with various implementations described herein. The memory structure 300 in FIG. 3 has similar components and features as described in reference to memory structure 100 of FIG. 1.

In various implementations, the multiple pairs of passgates coupled to the pair of bitlines (BL, BLB) may include any number (N) of pairs of passgates. For instance, as shown in FIG. 3, the memory structure 300 may include a third pair of passgates (T5/T6) that are coupled between the at least one pair of bitlines (BL, BLB) and the at least one pair of ancillary lines (BL_W, BLB_W). In this instance, each passgate (T5, T6) of the third pair of passgates (T5/T6) may be selectively activated with the write enable signal (e.g., GWEN) during write operations so as to reduce resistance on the at least one pair of bitlines (BL, BLB) during the write operations. In other instances, each passgate (T5, T6) of the third pair of passgates (T5/T6) may be selectively deactivated with the write enable signal (e.g., GWEN) during read operations so as to reduce capacitance on the at least one pair of bitlines (BL, BLB) during the read operations.

In some implementations, the third pair of passgates (T5/T6) may include a fifth passgate (T5) coupled between the first bitline (BL) and the first ancillary line (BL_W), and the third pair of passgates (T5/T6) may include a sixth passgate (T6) coupled between the second bitline (BLB) and the second ancillary line (BLB_W). I.e., in this instance, the third pair of passgates (T5/T6) are implemented with a fifth transistor (T5) and a sixth transistor (T6). In some implementations, the transistors (T5, T6) are NMOS transistors. However, in other implementations, P-type MOS transistors may be used.

In some implementations, the memory structure 300 may include any number (N) of inverters. For instance, the memory structure 300 may include a third inverter (I3) coupled to gates of the third pair of passgates (T5/T6). The third inverter (I3) may receive the write enable signal (GWEN), invert the write enable signal (GWEN), and provide an inverted write enable signal to the gates of the third pair of passgates (T5/T6). As shown, the third inverter (I3) is coupled to the gates of the third pair of passgates (T5/T6), and the passgates (T5, T6) may be activated based on the inverted write enable signal provided by the third inverter (I3). Also, the third pair of passgates (T5/T6) have their gates coupled to an output of the third inverter (I3) via a third (or middle or central) bitline connection line (BL_CONNECT_MID), and the third inverter (I3) receives the write enable signal (GWEN) having a logic state of zero (0) and provides an inverted write enable signal having a logic state of one (1) to the gates of the passgates (T5, T6) for activation thereof via the third (or middle) bitline connection line (BL_CONNECT_MID).

Figure 4:
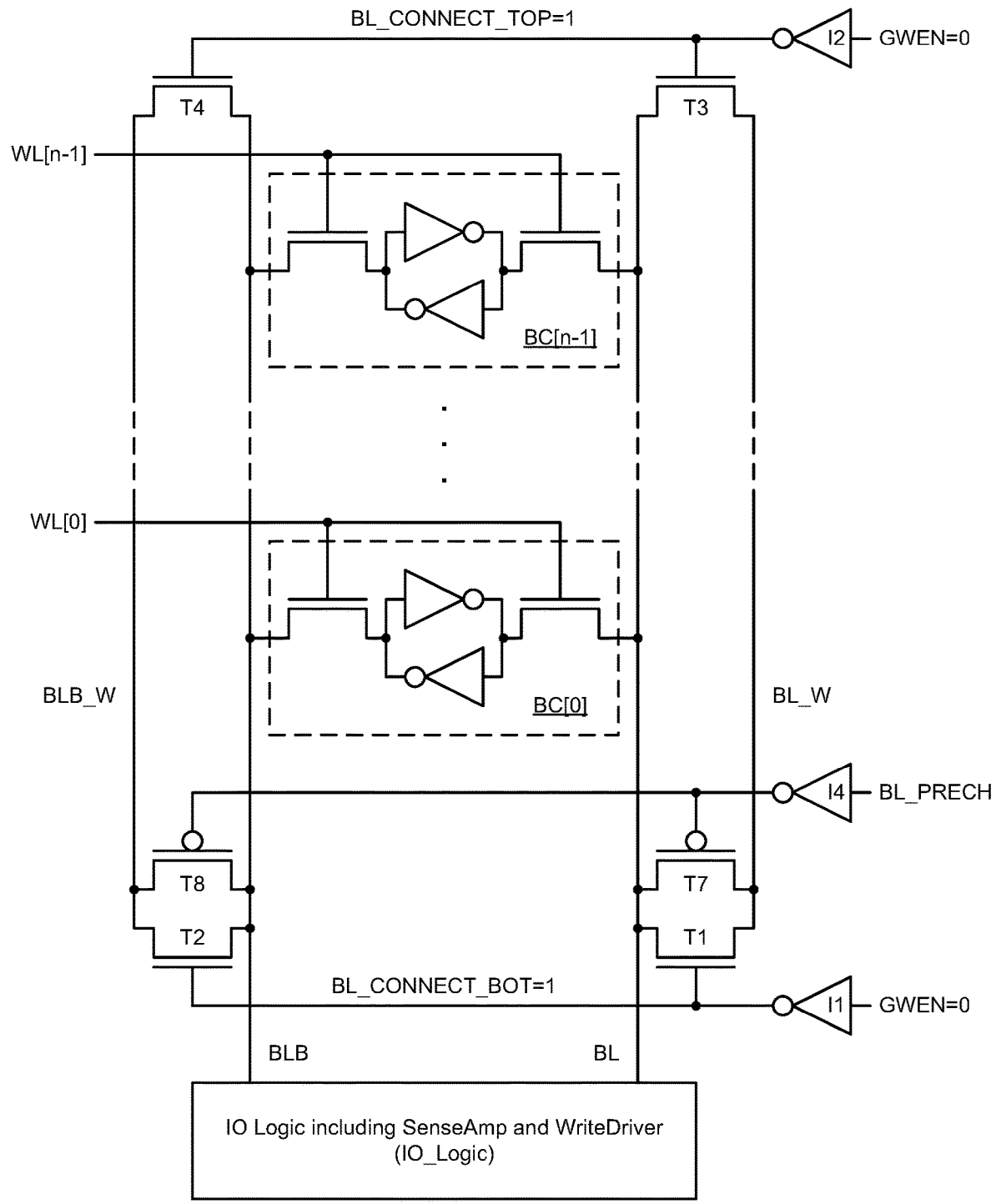
FIG. 4 illustrates a diagram of a memory structure with bitline strapping and precharge circuitry in accordance with implementations described herein.

FIG. 4 illustrates a diagram of a memory structure 400 having bitline strapping with precharge circuitry in accordance with implementations described herein. The memory structure 400 in FIG. 4 has similar components and features as described in reference to memory structure 100 of FIG. 1.

In various implementations, as shown in FIG. 4, the memory structure 400 may include at least one pair of precharge passgates (T7/T8) that are coupled between the at least one pair of bitlines (BL, BLB) and the at least one pair of ancillary lines (BL_W, BLB_W). The at least one pair of precharge passgates (T7/T8) may be used to precharge the at least one pair of bitlines (BL, BLB) to a high voltage state, such as, e.g., a voltage value corresponding to a logic state of one (1). In this instance, each precharge passgate (T7, T8) of the at least one pair of precharge passgates (T7/T8) is selectively activated with a bitline precharge signal (e.g., BL_PRECH), and each precharge passgate (T7, T8) of the at least one pair of precharge passgates (T7/T8) may be selectively deactivated with the bitline precharge signal (e.g., BL_PRECH).

In some implementations, the at least one pair of precharge passgates (T7/T8) may include a seventh passgate (T7) (e.g., transistor) coupled between the first bitline (BL) and the first ancillary line (BL_W), and the pair of precharge passgates (T7/T8) may include an eighth passgate (T8) (e.g., transistor) coupled between the second bitline (BLB) and the second ancillary line (BLB_W). In some implementations, the passgates or transistors (T7, T8) are PMOS transistors. However, in other implementations, N-type MOS transistors may be used.

In some implementations, the memory structure 400 includes a fourth inverter (I4) coupled to gates of the pair of precharge passgates (T7/T8). The fourth inverter (I4) may receive the bitline precharge signal (BL_PRECH), invert the bitline precharge signal (BL_PRECH), and provide an inverted bitline precharge signal to gates of the at least one pair of precharge passgates (T7/T8). As shown, the fourth inverter (I4) is coupled to the gates of the pair of precharge passgates (T7/T8), and the precharge passgates (T7, T8) may be activated based on the inverted bitline precharge signal provided by the fourth inverter (I4). In this instance, the pair of precharge passgates (T7/T8) have their gates coupled to an output of the fourth inverter (I4), and the fourth inverter (I4) may receive the bitline precharge signal (BL_PRECH) having a logic state of one (1) and provide an inverted bitline precharge signal having a logic state of one (0) to the gates of the pair of precharge passgates (T7/T8) for activation thereof.

Figure 5A:
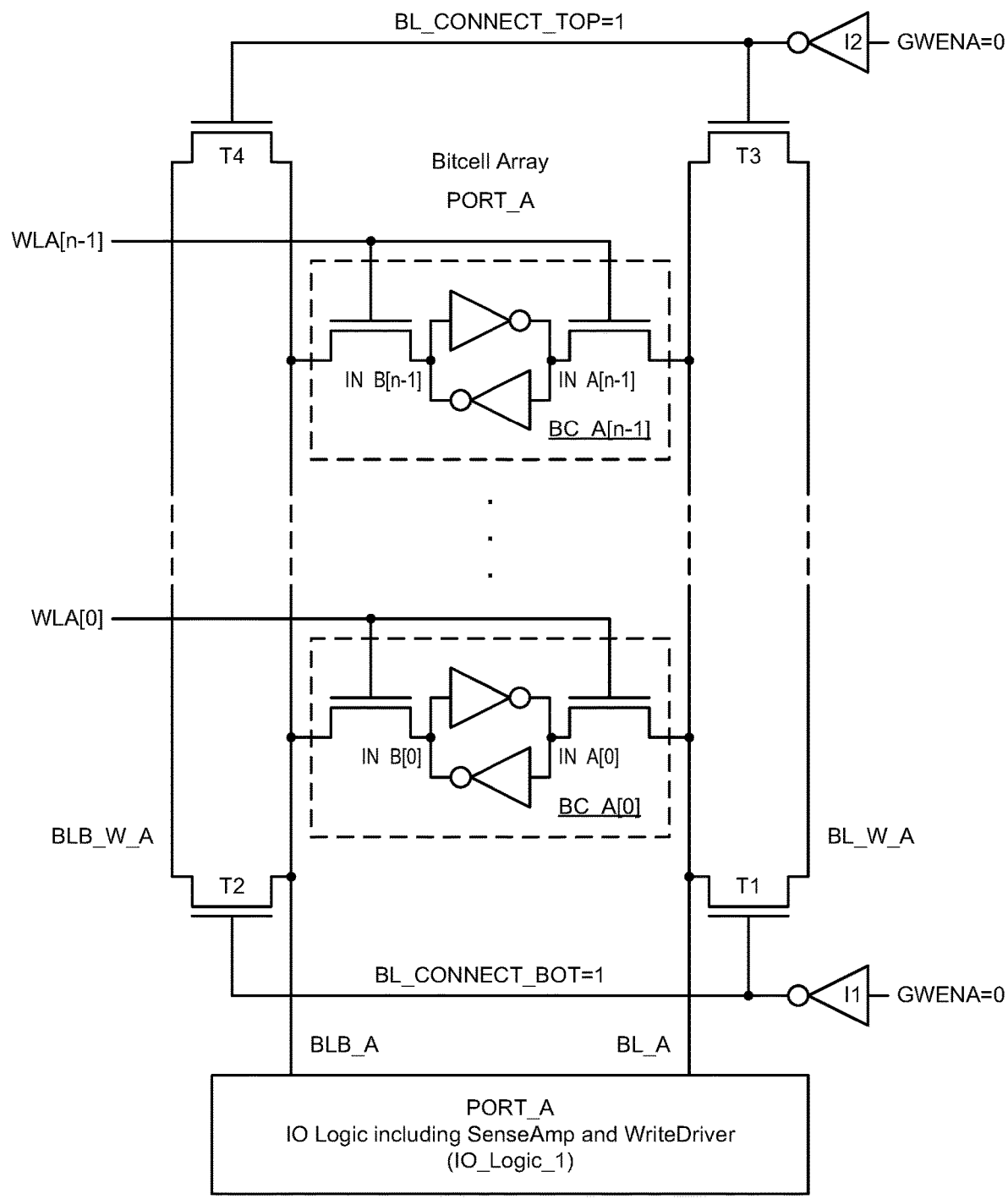
FIGS. 5A-5B illustrate a diagram of a multi-port memory structure with bitline strapping in accordance with various implementations described herein.
Figure 5B:
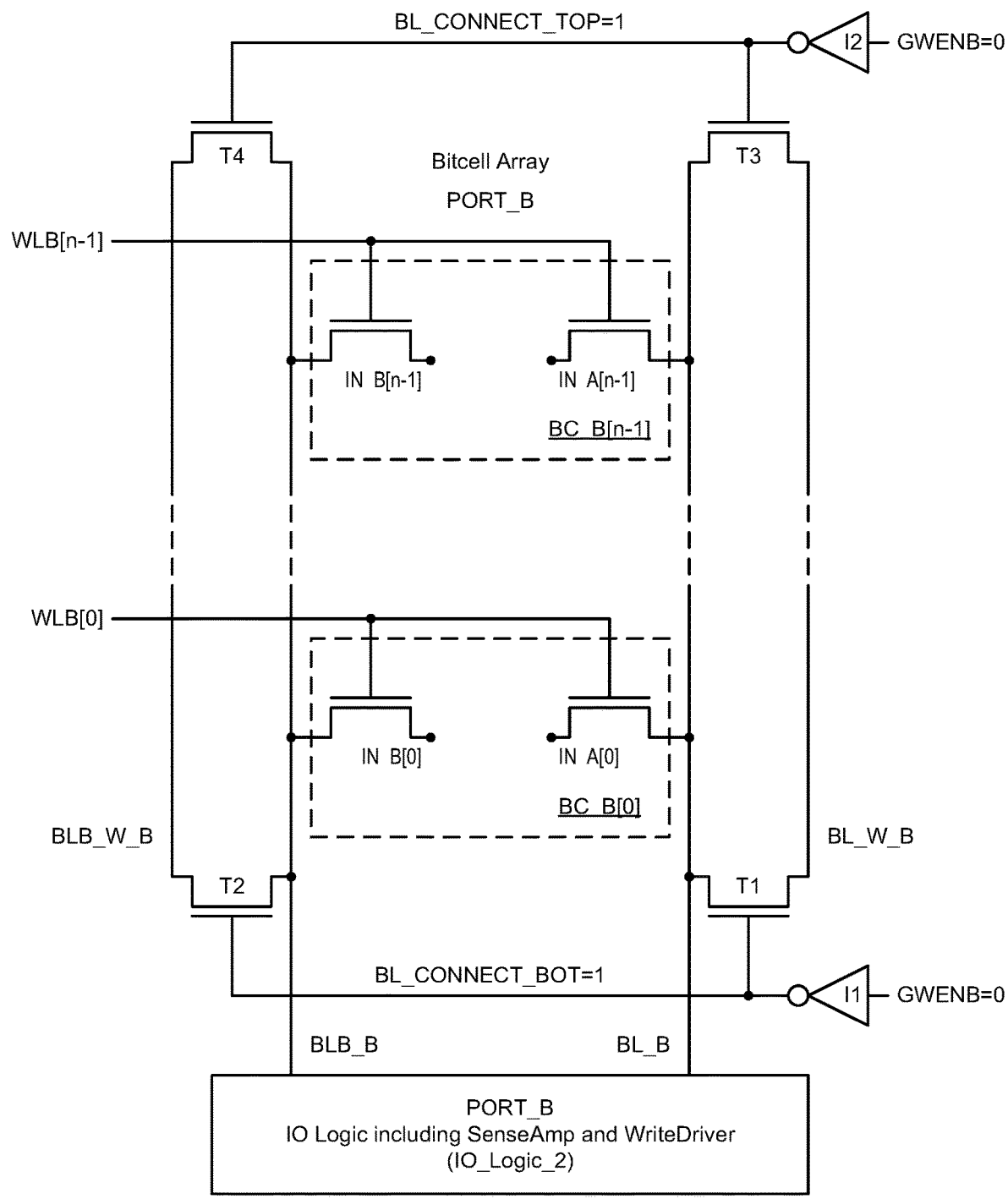

FIGS. 5A-5B illustrate a diagram of a multi-port memory structure 500 having bitline strapping in accordance with implementations described herein. In particular, FIG. 5A illustrates a diagram of first part 500A of a dual-port memory structure 500 having bitline strapping, and FIG. 5B illustrates a diagram of second part 500B of the dual-port memory structure 500 having bitline strapping. The memory structures 500, 500A, 500B in FIGS. 5A-5B have similar components and features as described in reference to memory structure 100 of FIG. 1. In some implementations, as shown, the memory structure 500 may be implemented as an integrated circuit (IC) that is configured as a dual-port memory structure. In various other implementations, the memory structure 500 may be implemented as an integrated circuit (IC) that is configured for any number (N) of ports as a multi-port memory structure, wherein the dual-port memory structure of FIGS. 5A-5B is one implementation of a multi-port memory structure.

As shown in FIGS. 5A-5B, the memory structure 500, 500A, 500B may include an array of bitcells, such as, e.g., a single memory array having two ports: PORT_A in FIG. 5A and PORT_B in FIG. 5B. In this instance, for PORT_A, the array of bitcells includes bitcells (BC_A[0], . . . , BC_A[n−1]) that are accessible via a first pair of bitlines (BL_A, BLB_A) and wordlines (WLA[0], . . . , WLA[n−1]). For PORT_B, the same array of bitcells (BC_B[0], . . . , BC_B[n−1]) are accessible via a second pair of bitlines (BL_B, BLB_B) and wordlines (WLB[0], . . . , WLB[n−1]). Also, as shown, the array of bitcells (for PORT_A and PORT_B) are coupled between multiple pairs of bitlines (BL_A/BLB_A and BL_B/BLB_B) including a first pair of bitlines (BL_A/BLB_A) and a second pair of bitlines (BL_B/BLB_B). Also, internal nodes (IN_A[0], . . . , IN_A[n−1], IN_B[0], . . . , IN_B[n−1]) shown in FIG. 5B are coupled to the same internal nodes (IN_A[0], . . . , IN_A[n−1], IN_B[0], . . . , IN_B[n−1]) shown in FIG. 5A.

The memory structure 500, 500A, 500B may include multiple pairs of ancillary lines (BL_W_A/BLB_W_A and BL_W_B/BLB_W_B) disposed adjacent to the multiple pair of bitlines (BL_A/BLB_A and BL_B/BLB_B). In this instance, the multiple pairs of ancillary lines (BL_W_A/BLB_W_A and BL_W_B/BLB_W_B) include a first pair of ancillary lines (BL_W_A/BLB_W_A) disposed adjacent to the first pair of bitlines (BL_A/BLB_A) and a second pair of ancillary lines (BL_W_B/BLB_W_B) disposed adjacent to the second pair of bitlines (BL_B/BLB_B). In addition, the memory structure 500, 500A, 500B may include multiple pairs of passgates (T1/T2 and T3/T4 for PORT_A and PORT_B) that are coupled between the multiple pairs of bitlines (BL_A/BLB_A and BL_B/BLB_B) and also the multiple pairs of ancillary lines (BL_W_A/BLB_W_A and BL_W_B/BLB_W_B).

Further, as shown in FIG. 5A-5B, the memory structure 500, 500A, 500B may include multiple input/output (IO) logic circuitry (IO_logic_1 in FIG. 5A and IO_logic_2 in FIG. 5B) that have multiple types of read/write circuits, such as, e.g., one or more sense amplifiers (SA) and one or more write drivers (WD) that are respectively coupled to the multiple bitlines (BL_W_A/BLB_W_A and BL_W_B/BLB_W_B). For instance, as shown in FIG. 5A, the memory structure 500, 500A may include first IO logic circuitry (IO_logic_1), and as shown in FIG. 5B, the memory structure 500, 500B may include second IO logic circuitry (IO_logic_2).

In some implementations, each passgate (T1, T2, T3, T4) of the multiple pairs of passgates (T1/T2 and T3/T4 for PORT_A and PORT_B) may be selectively activated with a write enable signal (e.g., GWEN) during write operations so as to reduce resistance on the multiple pairs of bitlines (BL_A/BLB_A and BL_B/BLB_B), respectively, during the write operations. Also, each passgate (T1, T2, T3, T4) of the multiple pairs of passgates (T1/T2 and T3/T4 for PORT_A and PORT_B) may be selectively deactivated with a write enable signal (e.g., GWEN) during read operations so as to reduce capacitance on the multiple pairs of bitlines (BL_A/BLB_A and BL_B/BLB_B), respectively, during the read operations. The dual-port memory structure has multiple ports including, e.g., a first port (PORT_A) and a second port (PORT_B).

As shown in FIG. 5A, the multiple pairs of passgates (T1/T2 and T3/T4 for the first port (PORT_A)) may include a first pair of passgates (T1/T2 for PORT_A) that are coupled between the first pair of bitlines (BL_A/BLB_A) and the first pair of ancillary lines (BL_W_A/BLB_W_A). In addition, the multiple pairs of passgates (T1/T2 and T3/T4 for PORT_A) may include a second pair of passgates (T3/T4 for PORT_A) that are coupled between the first pair of bitlines (BL_A/BLB_A) and the first pair of ancillary lines (BL_W_A/BLB_W_A).

As shown in FIG. 5B, the multiple pairs of passgates (T1/T2 and T3/T4 for the second port (PORT_B)) may include a third pair of passgates (T1/T2 for PORT_B) that are coupled between the second pair of bitlines (BL_B/BLB_B) and the second pair of ancillary lines (BL_W_B/BLB_W_B). In addition, the multiple pairs of passgates (T1/T2 and T3/T4 for PORT_B) may include a fourth pair of passgates (T3/T4 for PORT_B) that are coupled between the second pair of bitlines (BL_A/BLB_A) and the second pair of ancillary lines (BL_W_A/BLB_W_A).

Figure 6:
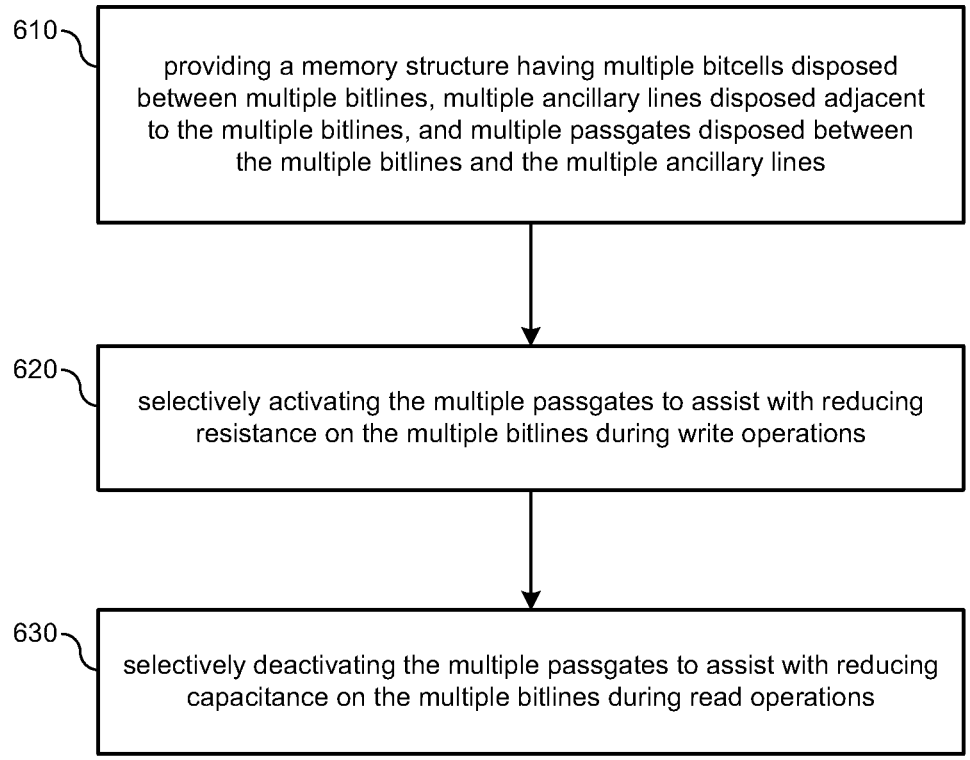
FIG. 6 illustrates a process flow diagram of a method for providing a memory structure with bitline strapping in accordance with implementations described herein.

FIG. 6 illustrates a process diagram of a method 600 for providing a memory structure with bitline strapping in accordance with implementations described herein.

It should be understood that even though method 600 indicates a particular order of operation execution, in some cases, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5B. Also, if implemented in software, method 600 may be implemented as a program or software instruction process configured for providing a memory structure with bitline strapping, as described herein. Further, if implemented in software, instructions related to implementing the method 600 may be stored in memory and/or a database. For instance, a computer or various other types of computing devices having a processor and memory may be configured to perform method 600.

As described and shown in reference to FIG. 6, method 600 may be used for fabricating and/or manufacturing, or causing to be fabricated and/or manufactured, an integrated circuit (IC) that implements the bitline strapping schemes and techniques as described herein that are related to providing a memory structure with bitline strapping and/or various associated devices, components and circuitry.

At block 610, method 600 may provide a memory structure having multiple bitcells disposed between multiple bitlines, multiple ancillary lines disposed adjacent to the multiple bitlines, and multiple passgates disposed between the multiple bitlines and the multiple ancillary lines. In some instances, each bitline of the multiple bitlines have one or more layers arranged in a z-direction, and each layer of the one or more layers are electrically shorted together. Similarly, each ancillary line of the multiple ancillary lines may have one or more layers arranged in a z-direction, and each layer of the one or more layers are electrically shorted together. In various implementations, the memory structure may be a single port memory structure or a multi-port memory structure.

At block 620, method 600 may selectively activate the multiple passgates to assist with reducing resistance (or to facilitate reduction of resistance) on the multiple bitlines during write operations. In this instance, each passgate of the multiple passgates is selectively activated with a write enable signal (e.g., GWEN) during write operations so as to reduce resistance on the multiple bitlines during the write operations.

At block 630, method 600 may selectively deactivate the multiple passgates to assist with reducing capacitance (or to facilitate reduction of capacitance) on the multiple bitlines during read operations. In this instance, each passgate of the multiple passgates is selectively deactivated with the write enable signal (e.g., GWEN) during read operations so as to reduce capacitance on the multiple bitlines during the read operations.

Described herein are various implementations of an integrated circuit. The integrated circuit may include an array of bitcells coupled between at least one pair of bitlines including a first bitline and a second bitline that is a complement of the first bitline. The integrated circuit may include at least one pair of ancillary lines disposed adjacent to the at least one pair of bitlines. The at least one pair of ancillary lines may include a first ancillary line disposed adjacent to the first bitline and a second ancillary line disposed adjacent to the second bitline. The integrated circuit may include multiple pairs of passgates coupled between the at least one pair of bitlines and the at least one pair of ancillary lines.

Described herein are various implementations of an integrated circuit. The integrated circuit may include an array of bitcells coupled between multiple pairs of bitlines including a first pair of bitlines and a second pair of bitlines. The integrated circuit may include multiple pairs of ancillary lines disposed adjacent to the multiple pair of bitlines. The multiple pairs of ancillary lines may include a first pair of ancillary lines disposed adjacent to the first pair of bitlines and a second pair of ancillary lines disposed adjacent to the second pair of bitlines. The integrated circuit may include multiple pairs of passgates coupled between the multiple pairs of bitlines and the multiple pairs of ancillary lines.

Described herein are various implementations of a method. The method may include providing a memory structure having multiple bitcells disposed between multiple bitlines, multiple ancillary lines disposed adjacent to the multiple bitlines, and multiple passgates disposed between the multiple bitlines and the multiple ancillary lines. The method may include selectively activating the multiple passgates to facilitate reduction of resistance on the multiple bitlines during write operations. The method may include selectively deactivating the multiple passgates facilitate reduction of capacitance on the multiple bitlines during read operations.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   an array of bitcells coupled between at least one pair of bitlines including a first bitline and a second bitline that is a complement of the first bitline;
   at least one pair of ancillary lines disposed adjacent to the at least one pair of bitlines, wherein the at least one pair of ancillary lines include a first ancillary line disposed adjacent to the first bitline and a second ancillary line disposed adjacent to the second bitline;
   multiple pairs of passgates coupled between the at least one pair of bitlines and the at least one pair of ancillary lines; and
   multiple inverters coupled to gates of the multiple pairs of passgates;
   wherein the multiple inverters comprise a first inverter and a second inverter, wherein the first inverter is coupled to the gates of a first pair of passgates of the multiple pairs of passgates, and wherein the second inverter is coupled to the gates of a second pair of passgates of the multiple pairs of passgates.

2. The integrated circuit of claim 1, wherein each passgate of the multiple pairs of passgates is selectively activated with a write enable signal during write operations to reduce resistance on the at least one pair of bitlines during the write operations.

3. The integrated circuit of claim 1, wherein each passgate of the multiple pairs of passgates is selectively deactivated with a write enable signal during read operations to reduce capacitance on the at least one pair of bitlines during the read operations.

4. The integrated circuit of claim 1, wherein the multiple pairs of passgates include a first pair of passgates having:
   a first passgate coupled between the first bitline and the first ancillary line, and
   a second passgate coupled between the second bitline and the second ancillary line.

5. The integrated circuit of claim 4, wherein the multiple pairs of passgates include a second pair of passgates having:
   a third passgate coupled between the first bitline and the first ancillary line, and
   a fourth passgate coupled between the second bitline and the second ancillary line.

6. The integrated circuit of claim 1,
   wherein the multiple inverters receive a write enable signal, invert the write enable signal, and provide an inverted write enable signal to the gates of the multiple pairs of passgates, and
   wherein the multiple passgates are activated based on the inverted write enable signal.

7. An integrated circuit, comprising:
   an array of bitcells coupled between at least one pair of bitlines including a first bitline and a second bitline that is a complement of the first bitline;
   at least one pair of ancillary lines disposed adjacent to the at least one pair of bitlines, wherein the at least one pair of ancillary lines include a first ancillary line disposed adjacent to the first bitline and a second ancillary line disposed adjacent to the second bitline; and
   multiple pairs of passgates coupled between the at least one pair of bitlines and the at least one pair of ancillary lines;
   wherein:
     each bitline of the at least one pair of bitlines has one or more layers arranged in a z-direction, and wherein the one or more layers are electrically shorted together; or
     each ancillary line of the at least one pair of ancillary lines has one or more layers arranged in a z-direction, and wherein the one or more layers are electrically shorted together.

8. The integrated circuit of claim 1, further comprising:
   at least one pair of precharge passgates coupled between the at least one pair of bitlines and the at least one pair of ancillary lines,
   wherein the at least one pair of precharge passgates are used to precharge the at least one pair of bitlines to a high voltage state.

9. The integrated circuit of claim 1, wherein the integrated circuit comprises a single port memory structure.

10. An integrated circuit, comprising:
   an array of bitcells coupled between multiple pairs of bitlines including a first pair of bitlines and a second pair of bitlines;
   multiple pairs of ancillary lines disposed adjacent to the multiple pair of bitlines, wherein the multiple pairs of ancillary lines include a first pair of ancillary lines disposed adjacent to the first pair of bitlines and a second pair of ancillary lines disposed adjacent to the second pair of bitlines;
   multiple pairs of passgates coupled between the multiple pairs of bitlines and the multiple pairs of ancillary lines; and
   multiple inverters coupled to gates of the multiple pairs of passgates;
   wherein the multiple inverters comprise a first inverter and a second inverter, wherein the first inverter is coupled to the gates of a first pair of passgates of the multiple pairs of passgates, and wherein the second inverter is coupled to the gates of a second pair of passgates of the multiple pairs of passgates.

11. The integrated circuit of claim 10, wherein each passgate of the multiple pairs of passgates is selectively activated with a write enable signal during write operations to reduce resistance on the multiple pairs of bitlines during the write operations.

12. The integrated circuit of claim 10, wherein each passgate of the multiple pairs of passgates is selectively deactivated with a write enable signal during read operations to reduce capacitance on the multiple pairs of bitlines during the read operations.

13. The integrated circuit of claim 10, wherein the multiple pairs of passgates include:
   a first pair of passgates coupled between the first pair of bitlines and the first pair of ancillary lines,
   a second pair of passgates coupled between the first pair of bitlines and the first pair of ancillary lines,
   a third pair of passgates coupled between the second pair of bitlines and the second pair of ancillary lines,
   a fourth pair of passgates coupled between the second pair of bitlines and the second pair of ancillary lines.

14. The integrated circuit of claim 10, wherein the integrated circuit comprises a multi-port memory structure.

15. A method, comprising:
   providing a memory structure having multiple bitcells disposed between multiple bitlines, multiple ancillary lines disposed adjacent to the multiple bitlines, multiple passgates disposed between the multiple bitlines and the multiple ancillary lines, and multiple inverters coupled to gates of the multiple passgates, wherein:
     the multiple inverters comprise a first inverter and a second inverter,
     the first inverter is coupled to the gates of a first pair of passgates of the multiple passgates, and
     the second inverter is coupled to the gates of a second pair of passgates of the multiple passgates;
   selectively activating the multiple passgates to facilitate reduction of resistance on the multiple bitlines during write operations; and
   selectively deactivating the multiple passgates facilitate reduction of capacitance on the multiple bitlines during read operations.

16. A method, comprising:
   providing a memory structure having multiple bitcells disposed between multiple bitlines, multiple ancillary lines disposed adjacent to the multiple bitlines, and multiple passgates disposed between the multiple bitlines and the multiple ancillary lines;
   selectively activating the multiple passgates to facilitate reduction of resistance on the multiple bitlines during write operations;
   selectively deactivating the multiple passgates facilitate reduction of capacitance on the multiple bitlines during read operations; and
   wherein:
     each bitline of the multiple bitlines has one or more layers arranged in a z-direction, and wherein the one or more layers are electrically shorted together; or
     each ancillary line of the multiple ancillary lines has one or more layers arranged in a z-direction, and wherein the one or more layers are electrically shorted together.

17. The method of claim 15, wherein the memory structure comprises a single port memory structure or a multi-port memory structure.

\* \* \* \* \*